United States Patent
Yoshida et al.

(10) Patent No.: US 9,276,349 B2
(45) Date of Patent: Mar. 1, 2016

(54) RECEPTACLE FOR CONNECTING MODULAR ELECTRONIC INSTRUMENTS

(71) Applicant: YOKOGAWA ELECTRIC CORPORATION, Tokyo (JP)

(72) Inventors: Kenichi Yoshida, Tokyo (JP); Hiroshi Akaishi, Tokyo (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/618,811

(22) Filed: Feb. 10, 2015

(65) Prior Publication Data
US 2015/0349452 A1    Dec. 3, 2015

(30) Foreign Application Priority Data

May 27, 2014  (JP) ................. 2014-109270

(51) Int. Cl.
| | |
|---|---|
| *H01R 4/50* | (2006.01) |
| *H01R 13/518* | (2006.01) |
| *H01R 13/639* | (2006.01) |
| *H01R 13/66* | (2006.01) |

(52) U.S. Cl.
CPC ............ *H01R 13/518* (2013.01); *H01R 13/639* (2013.01); *H01R 13/665* (2013.01)

(58) Field of Classification Search
CPC ... H01R 13/518; H01R 13/639; H01R 13/665
USPC ........................................................ 439/347
See application file for complete search history.

(56) References Cited

U.S. PATENT DOCUMENTS

| | | | | |
|---|---|---|---|---|
| 2009/0112368 | A1* | 4/2009 | Mann, III ................ | B64F 1/364 700/275 |
| 2009/0196008 | A1* | 8/2009 | McColloch .......... | G02B 6/4201 361/818 |
| 2010/0159734 | A1* | 6/2010 | Horiuchi ............. | H01R 13/514 439/374 |
| 2014/0284463 | A1* | 9/2014 | Kuroda ................ | G02B 6/4201 250/216 |
| 2015/0108687 | A1* | 4/2015 | Snyder ................ | B29C 67/0088 264/308 |
| 2015/0115869 | A1* | 4/2015 | Edmunds ................ | H02S 30/10 320/101 |
| 2015/0257286 | A1* | 9/2015 | Sichmann ............ | H01R 4/4809 361/732 |

FOREIGN PATENT DOCUMENTS

JP         2010-009264 A       1/2010

\* cited by examiner

*Primary Examiner* — Jean F Duverne
(74) *Attorney, Agent, or Firm* — McDermott Will & Emery LLP

(57) ABSTRACT

A receptacle is provided to connect modular electronic instruments to each other. A box-shaped case has a front face having an opening for inserting a single modular electronic instrument into the box-shaped case. A first connector is disposed inside the box-shaped case to connect the single modular electronic instrument to the receptacle. A second connector is disposed on a first side face of the receptacle for connecting the receptacle to a first receptacle on the side of the first side face. A third connector is disposed on a second side face of the receptacle for connecting the receptacle to a second receptacle on the side of the second side face. A lock secures the connection with one of the first and second receptacles. A leg is disposed on the bottom face. The position of the leg is deviated only to one of the first or second side faces.

5 Claims, 13 Drawing Sheets

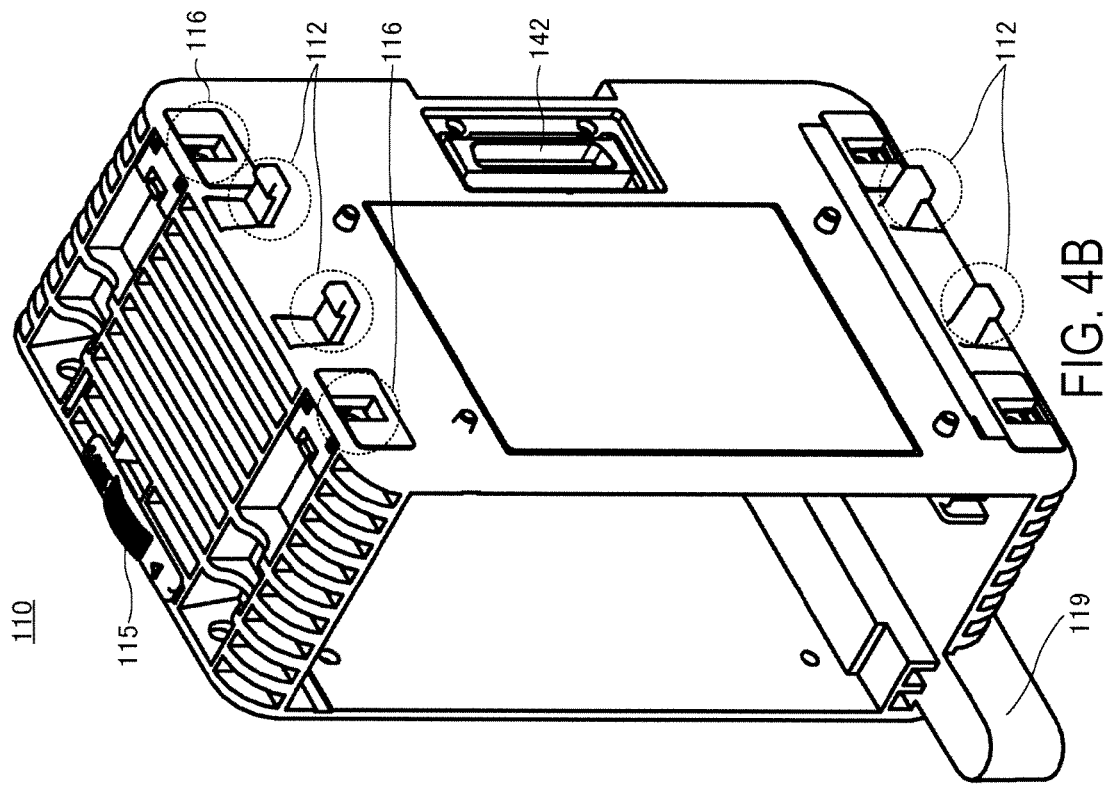
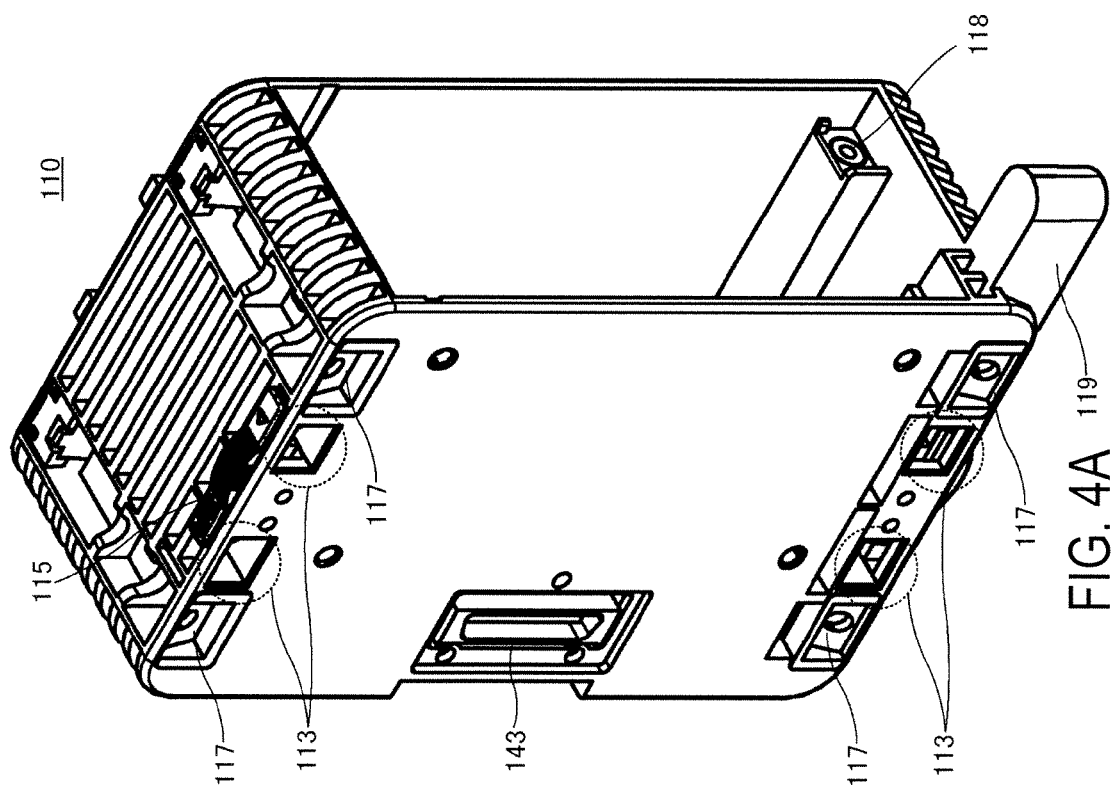

RECEPTACLE FOR CONNECTING MODULAR ELECTRONIC INSTRUMENTS

CROSS-REFERENCE TO RELATED APPLICATION

The present application claims priority from Japanese patent application No. 2014-109270 filed on May 27, 2014, the entire contents of which are hereby incorporated by reference.

TECHNICAL FIELD

The present disclosure relates to a modular electronic instrument connecting receptacle for connecting modular electronic instruments to each other.

DESCRIPTION OF RELATED ART

Electronic instruments including measurement instruments are configured to perform a variety of processes, such as processes for receiving measurement signals from a measurement subject, processes for performing calculations using the measured values, and processes for outputting the measurement results. Devices for performing the respective processes can be modularized, and required modules can be combined and connected together to form a single system. Modularization of electronic instruments makes it possible to form a system having a scale appropriate for accommodating the desired number of signal lines and for performing desired processes.

When a system is formed by connecting modules to each other, a mechanism is necessary for securing each of the modules not only to electrically connect the individual modules to each other, but also to achieve rigidity as a system. Conventionally, several different approaches have been proposed to connect modules to each other.

FIG. 10 is an example of a rack approach in which rack 411 is used to securely connect modules 412 to each other. Rack 411 has spaces for accommodating modules 412, respectively. Connectors (not shown) are disposed in the spaces for electrically connecting with respective modules 412, respectively.

Racks 411 have a variety of sizes depending on the scales of systems to be formed. The number of modules 412 that can be accommodated is determined by the size. Spaces for accommodating modules can also be left open. The size of the system can be determined by the size of selected rack 411, not by the number of modules 412 that can be connected to rack 411.

In this rack approach, each individual module 412 can be inserted or removed independently without interfering with other adjacent modules 412. The rigidity as a system can be secured by rack 411. This makes it possible to ensure high rigidity.

FIG. 11 is an example of a base plate approach in which base plate 421 is used to securely connect modules 422 to each other. Base plate 421 has spaces for attaching modules 422, respectively. Connectors 423 are disposed in the respective spaces for electrically connecting with respective modules 422.

Base plates 421 have a variety of sizes depending on the scales of systems to be formed. The number of modules 422 that can be accommodated is determined by the size. Spaces for attaching modules can also be left open. The size of the system is determined by the size of selected base plate 421, not by the number of modules 422 that can be connected to the base plate.

In this base plate approach, each individual module 422 can be inserted or removed independently without interfering with other adjacent modules 422, and the rigidity as a system can also be secured by base plate 421.

FIG. 12 is an example of an approach to connect modules, in which module 431 has a left face to which one module 431 is connected and a right face to which another module 431 is connected. Each module 431 has connectors 432 on its left and right faces, respectively, for electrically connecting other modules 431 to each other.

In this approach, the size of the system is determined by the number of modules 431 that can be connected together. However, when inserting or removing one module 431 disposed between other two modules 431, it is necessary to break the connections with other modules 431 on its left and the right. Moreover, the rigidity of the system is secured by modules 431.

FIG. 13 is an example of a connecting member approach, in which connecting members 441 are used to securely connect modules 442 to each other. Connecting member 441 includes connector 443 for connecting to module 442 electrically, and connector 444 for connecting with another connecting member 441.

In the connecting member approach, the size of the system is determined by the number of modules 442 that can be connected. Each individual module 442 can be inserted or removed independently without interfering with the other adjacent modules 422. The rigidity as a system is secured by modules 442 and connecting members 441.

While in the rack approach shown in FIG. 10, modules 412 can be inserted and removed independently and the rigidity is high as well, the size of the system is determined by the size of rack 411, rather than by the number of modules 412. Moreover, it is not possible to connect more modules 412 than the number of modules that can be accommodated within rack 411. Accordingly, there is a lack of flexibility for system expansion.

While in the base plate approach shown in FIG. 11, modules 422 can be inserted and removed independently, the size of the system is determined by the size of base plate 421, rather than by the number of modules 422. Moreover, it is not possible to connect more modules 422 than the number of modules that can be accommodated within base plate 421. Accordingly, there is a lack of flexibility for system expansion.

In the module connecting approach shown in FIG. 12, the size of the system is determined by the number of continuously connected modules 431. However, modules 431 cannot be inserted or removed independently. In particular, when a wall attachment or a DIN rail attachment is used with the system, module 431 can be inserted or removed only after removing the system as a whole from those attachments.

In the connecting member approach shown in FIG. 13, the size of the system is determined by the number of modules 442, and modules 442 can be inserted and removed independently. However, because the connection is made through the plate-shaped connecting member 444 alone, rigidity as a system is low.

While each of these conventional connection approaches has its own benefits and drawbacks, none is satisfactory in terms of the system size to be determined by the number of modules, the ability to insert and remove modules independently, and high rigidity as a system.

SUMMARY OF DISCLOSURE

The present disclosure discusses a connecting system which is able to achieve a system of which size is determined by the number of modules, which has the ability to insert and remove modules independently, and which has high rigidity as a system.

One aspect of the present disclosure is related to a receptacle for connecting modular electronic instruments to each other. The receptacle includes a box-shaped case having a front face, a bottom face, a first side face, and a second side face opposite to the first side face, the front face having an opening for inserting a single modular electronic instrument into the box-shaped case, a first connector disposed inside the box-shaped case, the first connector being configured to electrically connect the single modular electronic instrument to the receptacle, a second connector disposed on the first side face, the second connector being configured to electrically connect the receptacle to a first receptacle disposed on the side of the first side face, a third connector disposed on the second side face, the third connector being configured to electrically connect the receptacle to a second receptacle disposed on the side of the second side face, a lock configured to secure the connection with one of the first and second receptacles, and a leg disposed on the bottom face, the position of the leg being deviated only to one of the first or second side faces.

The receptacle may include an adder configured to receive an address from the first receptacle through the second connector, the address being set in the single modular electronic instrument connected to the first connector, add a value to the address, and output the address to the second receptacle through the third connector.

The lock may include a convex portion, a concave portion, and a slide lock, and the slide lock engages a convex portion, fitted into the concave portion, of the one of the first and second receptacles.

The second connector and the third connector may be attached to the box-shaped case with play.

The lock further includes a bolt receptacle in one of the first and second side faces, and the bolt receptacle comprises a nut and a nut cover for holding the nut to provide the nut with play in a diagonal direction relative to the box-shaped case.

Additional aspects and advantages of the present disclosure will become readily apparent to those skilled in the art from the following detailed description, wherein only exemplary embodiments of the present disclosure is shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

FIGS. 4A and 4B are left and right perspective diagrams of a connecting receptacle.

DESCRIPTION OF THE EMBODIMENT

Figure 1:
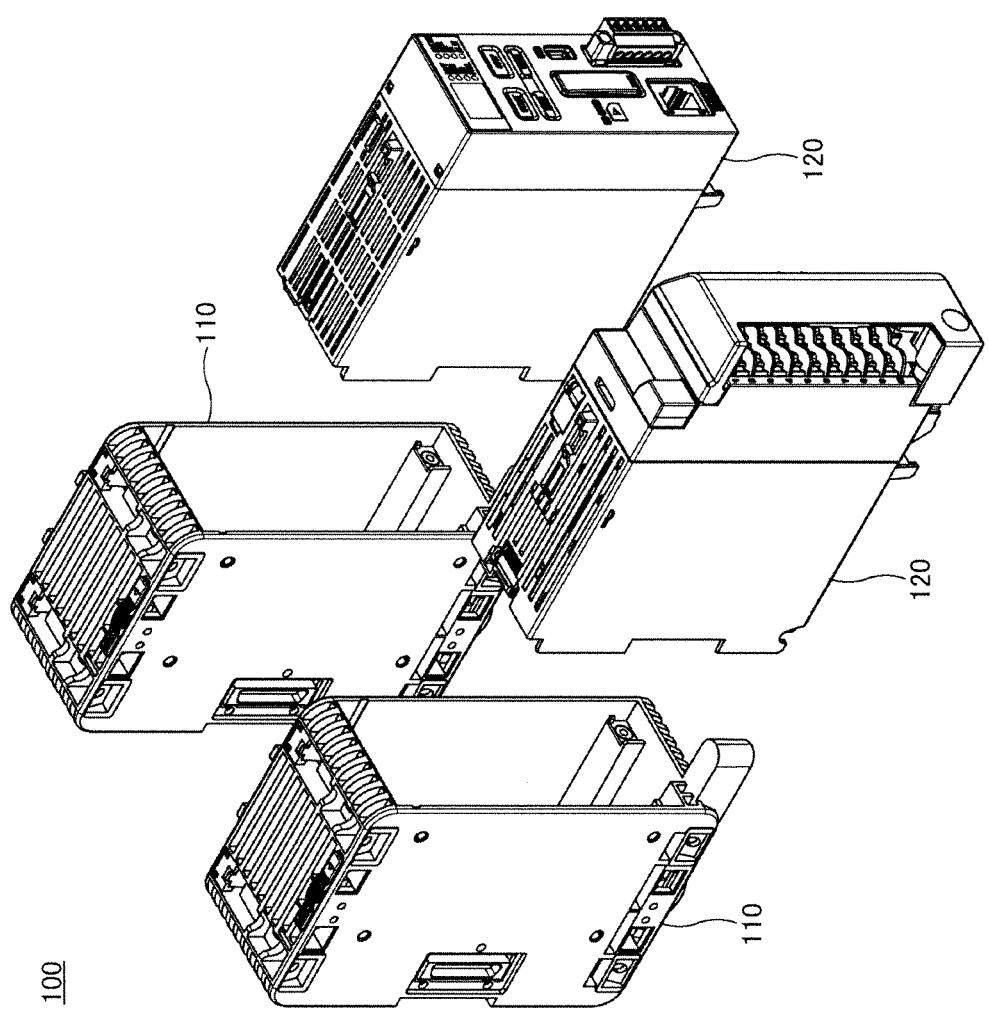
FIG. 1 is a diagram for explaining a module connecting structure according to one embodiment.

Embodiments of the present disclosure will be explained in reference to the accompanying drawings. FIG. 1 is a diagram for explaining a module connecting structure according to one embodiment. As illustrated in this figure, modules 120, which are electronic instruments, can be contained in respective connecting receptacles 110, and each connecting receptacle 110 is connected to both connecting receptacle on its left side and connecting receptacle on its right side to form system 100.

Module 120 can use any of various types of modular electronic instruments, such as, but not limited to, a measuring instrument including a data logger, a PLC (Programmable Logic Controller), and a temperature regulator. In the case of a measuring instrument, it may include, but not limited to, an I/O module, a data acquisition module, and a communication module.

Connecting receptacle 110 has substantially a vertically long rectangular box-shape with an opening in its one face. Module 120 can be inserted in the depth direction through the opening so that single module 120 can be contained within single connecting receptacle 110. In this disclosure, the opening is assumed to be provided in the front face, defining the front, back, left, right, and up, and down directions of connecting receptacle 110, with respect to the location of the opening.

Figure 2:
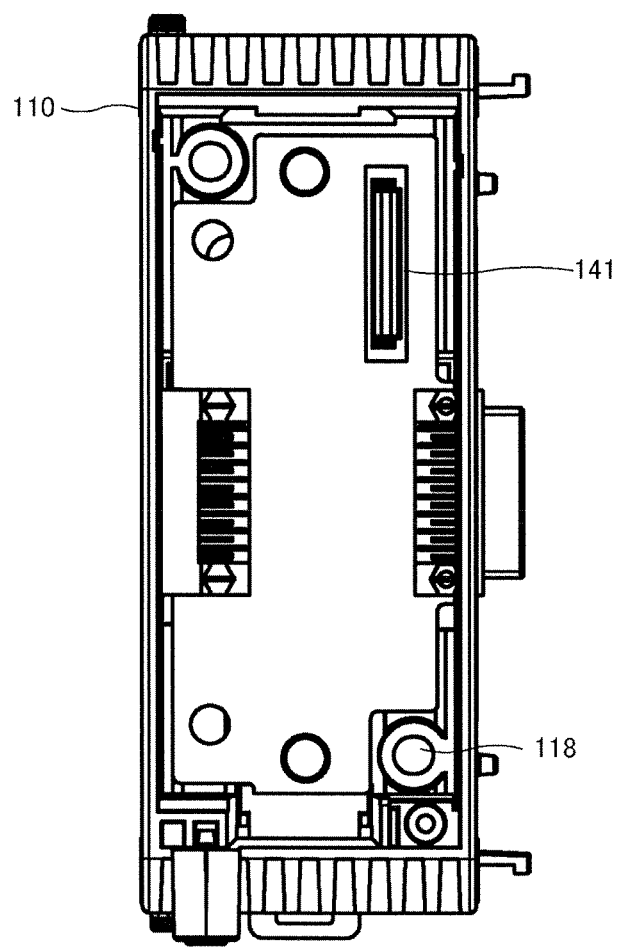
FIG. 2 is a front view of a connecting receptacle.

As illustrated in the front view in FIG. 2, connector 141 is provided at the back of the opening in connecting receptacle 110. When module 120 is inserted, a connector (not shown) of module 120 and connector 141 of connecting receptacle 110 are connected to each other. Inserted module 120 may be secured through a latch, a bolt, and so forth. The latch can be provided on the top face of module 120, and a groove for receiving the latch is formed on the inner surface of the top face of connecting receptacle 110. Moreover, bolt hole 118 for securing module 120 is formed in the vicinity of the opening of connecting receptacle 110.

Figure 3:
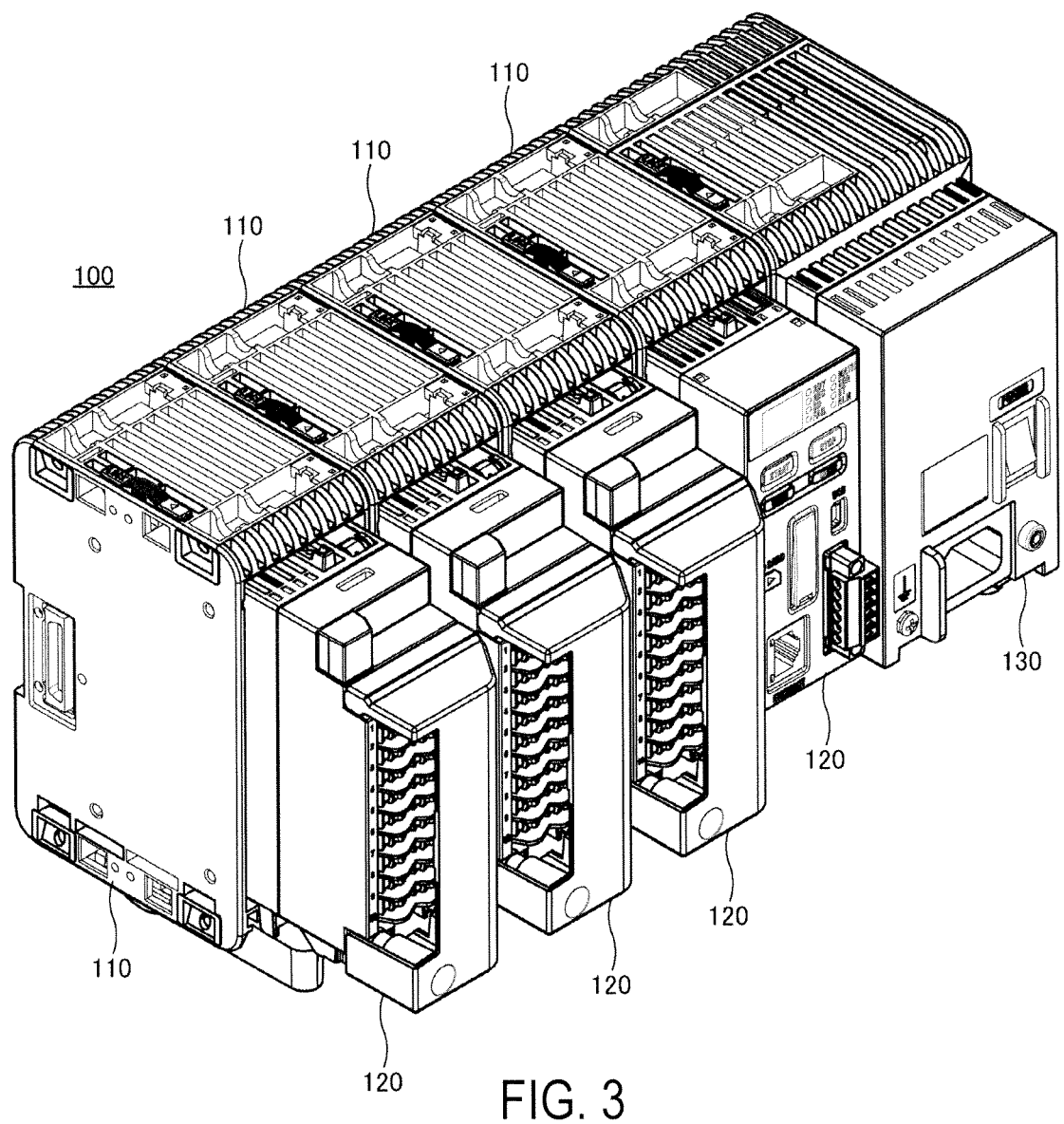
FIG. 3 is a diagram illustrating the state in which multiple modules contained in connecting receptacles are connected together, and a power supply module is connected as well.

FIG. 3 shows system 100 including four modules 120 contained within respective connecting receptacles 110, and power supply module 130 connected to one of connecting receptacles. A DIN rail attaching mechanism and a wall attaching mechanism may be provided on the back faces of connecting receptacles 110. In order to increase the rigidity, the top faces of connecting receptacles 110 each have a rib structure having grooves running in the front/back direction.

FIG. 4A is a perspective diagram showing connecting receptacle 110 from the front-left side, and FIG. 4B is a perspective diagram showing connecting receptacle 110 from the front-right side. As illustrated in these figures, connecting receptacle 110 includes connector 143 and connector 142 on the left and right side faces, respectively, in order to connect electrically to adjacent connecting receptacles 110. That is, connector 143 of connecting receptacle 110 that is positioned on the right side is connected to connector 142 of another connecting receptacle 110 that is positioned on the left side.

Connector 142 of connecting receptacle 110 and connector 143 of another connecting receptacle 110 are secured with bolts to cases of those connecting receptacle 110, but are not secured completely. Rather, they are attached with some play so as to be able to move upward, downward, leftward, rightward, forward, and a backward. Dimension tolerance errors are absorbed by this play. When a large number of connecting receptacles 110 connected to each other are attached to a DIN rail or to a wall, no excessive forces will be applied to connectors 142 or connectors 143 even when forcibly lining up connecting receptacles 110 in a straight line.

Figure 5A:
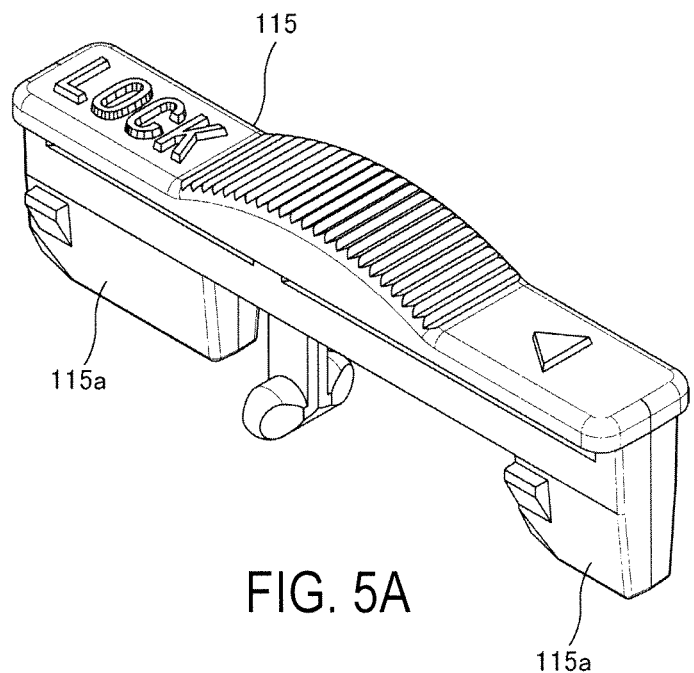
FIGS. 5A, 5B, and 5C are diagrams for explaining a slide lock for securing connecting receptacles together.
Figure 5B:
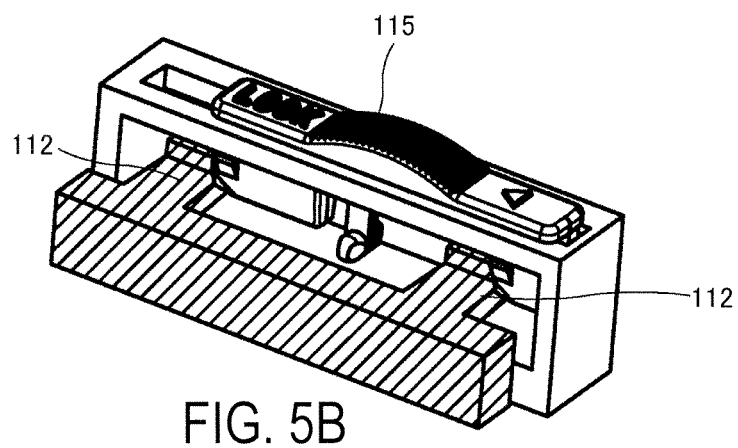
Figure 5C:
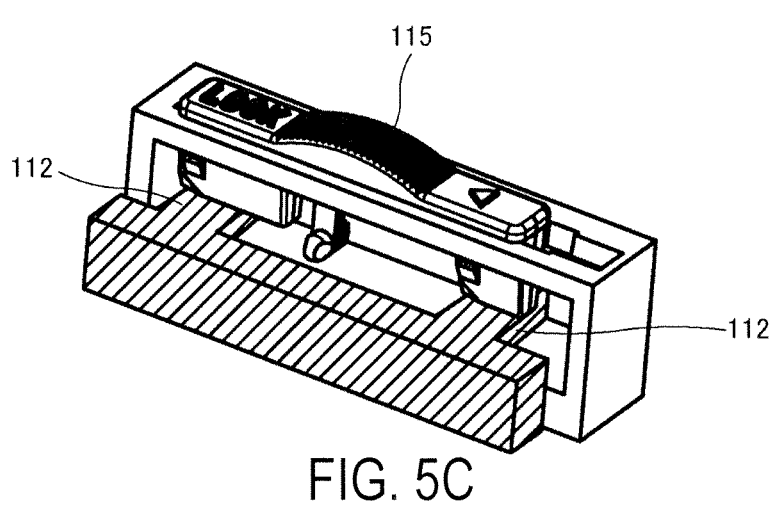

For example, connecting receptacles 110 can be secured together by fitting four convex portions 112 formed at the top and bottom of the right face of one connecting receptacle into concave portions 113 formed at the corresponding positions on the left face of the other connecting receptacle, and then sliding slide lock 115 of the other connecting receptacle in the locking direction. As illustrated in FIG. 5A, slide lock 115 has protrusion 115a. As shown in FIGS. 5B and 5B, when slide lock 115 is slid in the locking direction, protrusion 115a engages with convex portion 112 to secure connecting receptacles 110 together. That is, the locking mechanism may include convex portion 112, concave portion 113, and slide lock 115.

Bolt hole 116 is formed in the vicinity of convex portion 112, and bolt hole 117 is formed in the vicinity of concave portion 113. These bolt holes 116 and 117 are used to bolt connecting receptacles 110 together robustly. To facilitate easy bolting, bolt hole 116 and bolt hole 117 may be cut so that the bolt advances in a diagonal direction.

Figure 6A:
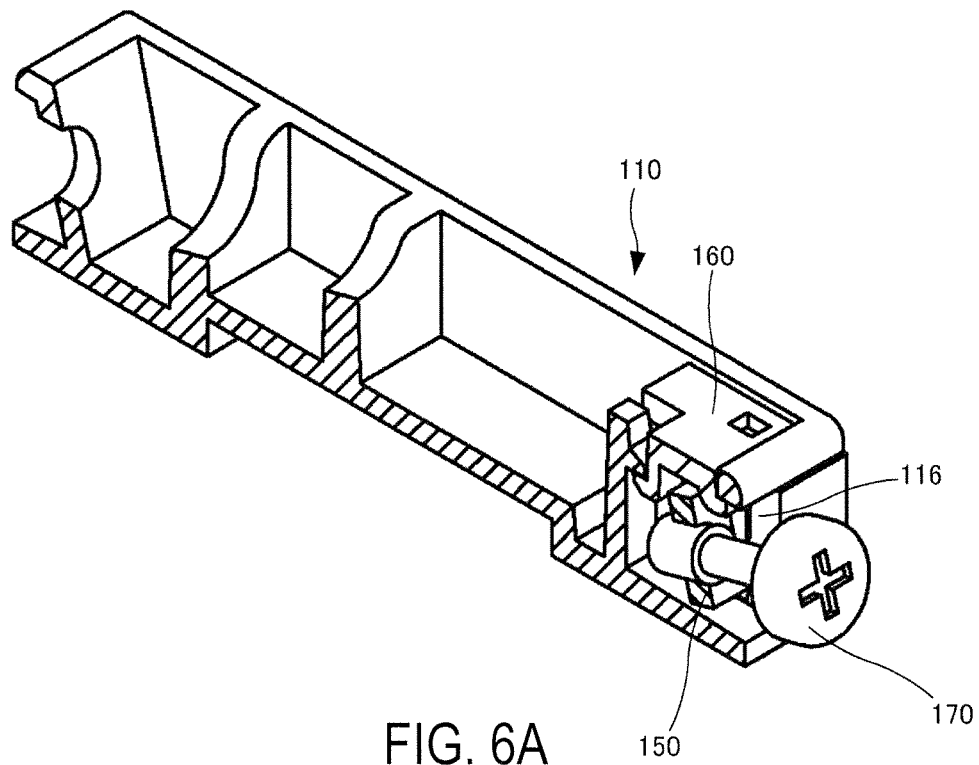
FIGS. 6A and 6B are diagrams for explaining a structure of a bolt hole.
Figure 6B:
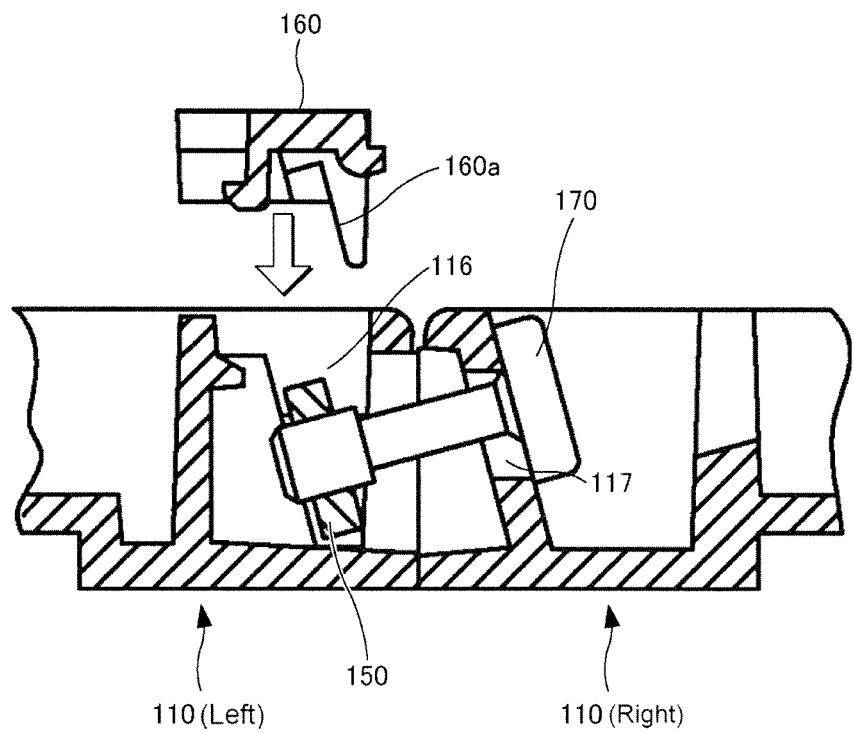

As shown in the perspective diagram in FIG. 6A and in the cross-sectional diagram of the connecting location in FIG. 6B, bolt-tightening corner nut 150 is disposed with a slant at the back of bolt hole 116 on the side that receives bolt 170. Bolt-tightening corner nut 150 is held in a slanted state by nut cover 160 that is formed with diagonal ribs 160a. Nut cover 160 has a latching portion, and fits to cover bolt hole 116.

Nut cover 160 is formed to allow bolt-tightening corner nut 150 to have some play for allowing the nut to move in the upward, downward, leftward, and rightward directions relative to connecting receptacle 110. This play is provided so that no excessive force will be applied to bolt 170 or bolt holes 116 and 117 when connecting to each other a large number of connecting receptacles 110, by absorbing the dimensional tolerance error.

Figure 7A:
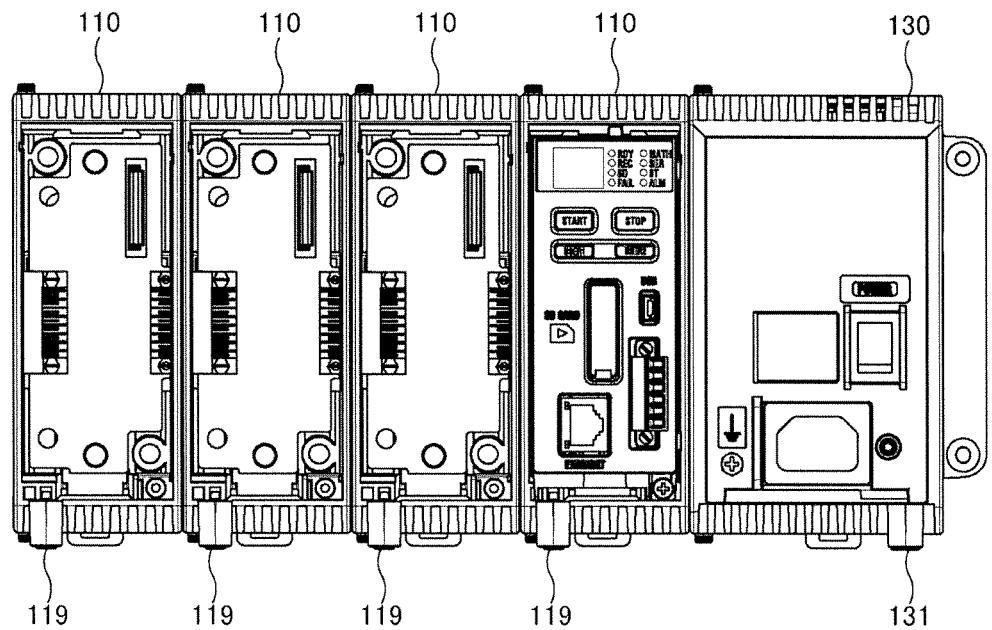
FIGS. 7A and 7B are a front view and a bottom view, respectively, showing that multiple connecting receptacles and a power supply module are connected to each other.

Leg 119 is formed on the bottom face of connecting receptacle 110 (FIGS. 4A and 4B). Leg 119 protrudes in the forward direction to increase stability, but leg 119 may be formed only on the left side of the bottom face. Modules 120 may be connected with power supply module 130 to receive the operating power. As illustrated in FIG. 7A, leg 131 is formed on the right side of the bottom face of power supply module 130, thus enabling the system as a whole to stand alone together with legs 119 of connecting receptacles 110.

Figure 7B:
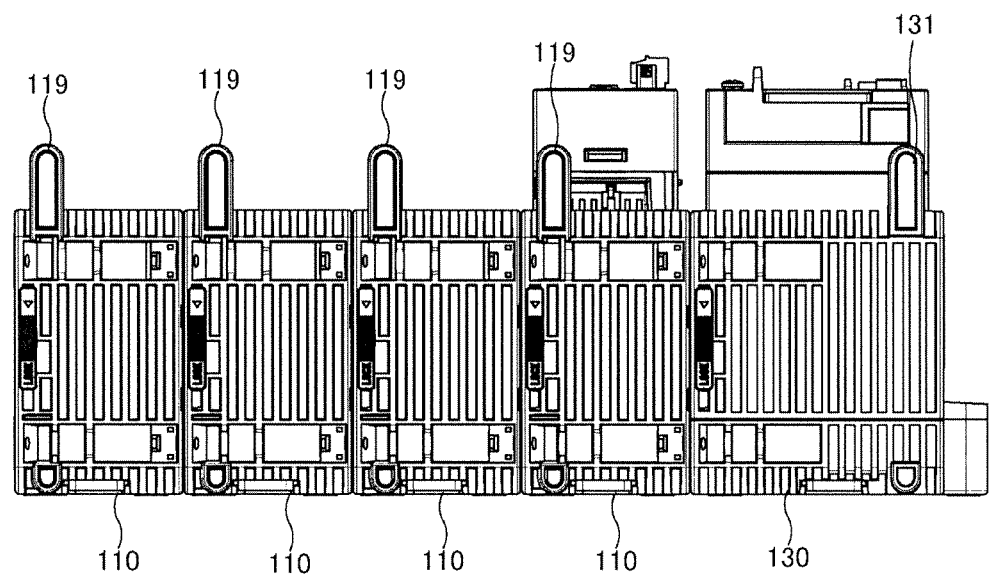

Even though connecting receptacle 110 cannot stand alone as a single unit, when in combination with power supply module 130, legs 119 and 131 are positioned on both ends of the system, enabling the system to stand alone. FIG. 7A is a diagram viewed from the forward direction of a system comprising power supply module 130 and four connecting receptacles 110 that contain four modules, respectively, and FIG. 7B is a diagram of the same system when viewed from the bottom.

Modules 120 in one embodiment are connected to each other in a state where they are contained within connecting receptacles 110. This can enable the size of the system to be determined by the number of modules used, and achieve high efficiency without wasted space. Moreover, because there is no restriction on the number of modules 120 that can be connected, expansion into a large-scale system becomes easy without waste.

Because modules 120 are connected to each other through connecting receptacles 110, respectively, each module 120 can be inserted and removed independently without interfering with other modules 120 existing on its left and right sides. Accordingly, maintainability may become excellent, and there is increased flexibility in combinations as well. The rigidity of the system is secured by box-shaped connecting receptacles 110, enabling high rigidity through robustly securing connecting receptacles 110 to each other.

Figure 8:
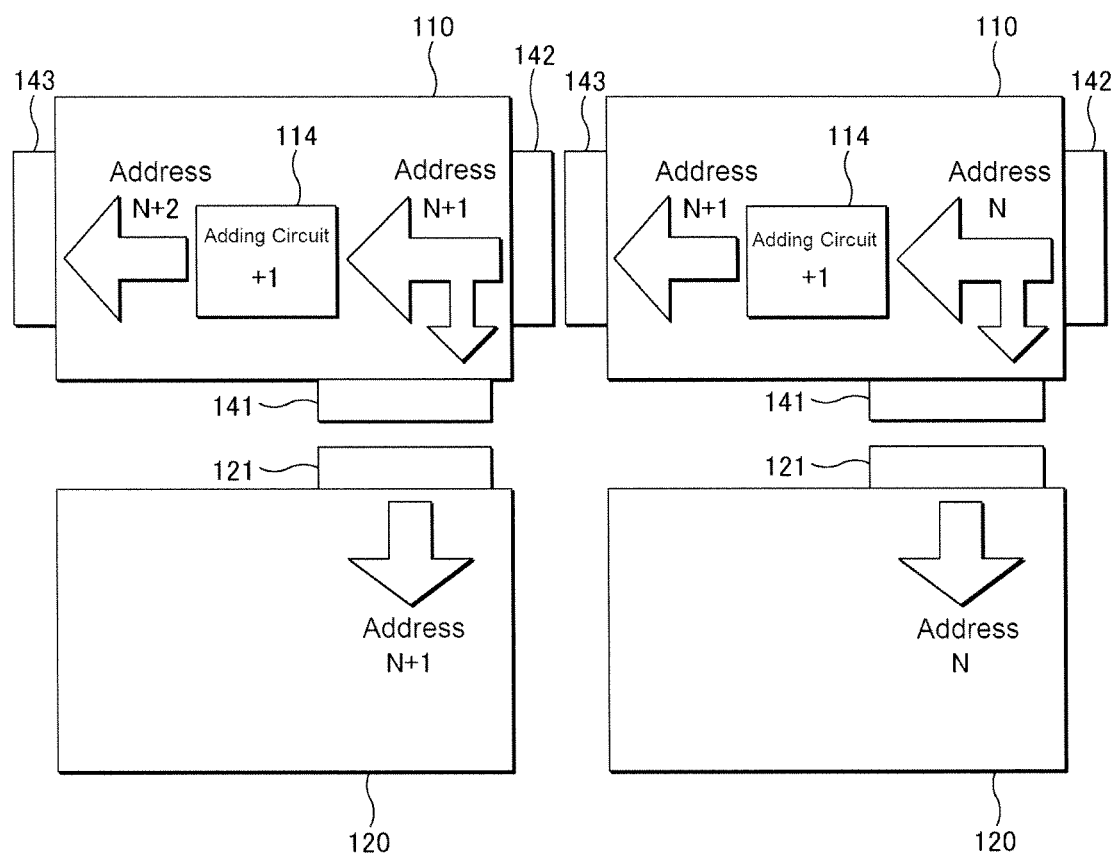
FIG. 8 is a diagram for explaining addresses to be set for the modules.

When multiple modules 120 are connected together, address information is needed in order to identify individual modules 120. As shown in FIG. 8, adder circuits 114 are provided in connecting receptacles 110, respectively, and addresses are automatically assigned by connecting receptacles 110 to corresponding modules 120.

As shown in FIG. 8, address N, acquired from adjacent connecting receptacle 110 (not shown in FIG. 8) that is connected through connector 142 of connecting receptacle (right in FIG. 8), is assigned through connector 141 to module 120 contained in right connecting receptacle 110. Adder circuit 114 of right connecting receptacle adds 1 to address N to provide address N+1 to connecting receptacle 110 (left in FIG. 8) through connector 143.

0, 1, and so forth can be defined as an initial address for connecting receptacle 110 disposed at the very end. This connecting receptacle 110 does not have another connecting receptacle 110 connected to its connector 142. Doing so enables connecting receptacles 110 to set unique addresses to connected modules 120.

Because of this, addresses can be set appropriately for each of individual modules 120, without having to set addresses manually using, for example, but not limited to, DIP switches, jumper pins, or dials, and without having to set addresses using set up tools such as control software. The value added by adder circuit 114 is not limited to 1, but may be a different prescribed value instead.

Figure 9A:
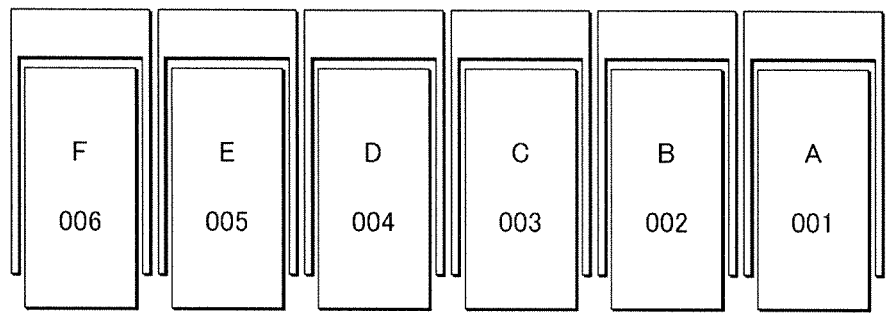
FIGS. 9A, 9B, and 9C are diagrams illustrating a specific example of setting addresses for the modules.
Figure 9B:
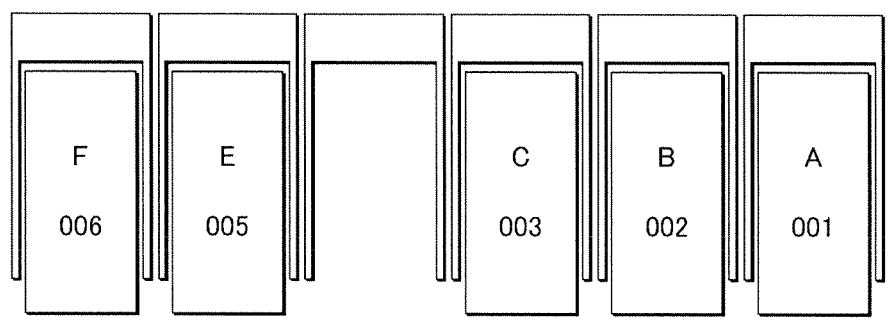
Figure 9C:
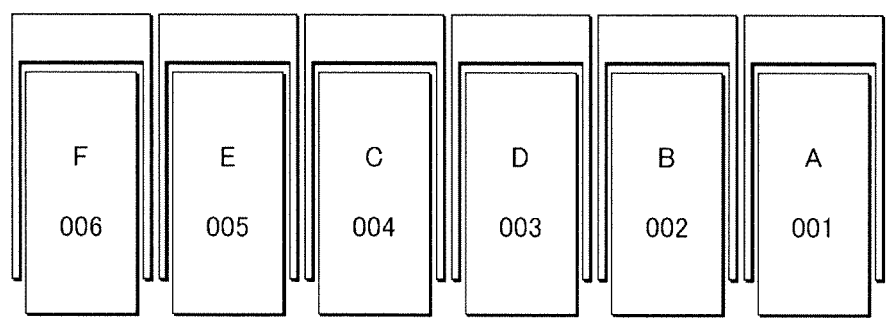
Figure 10:
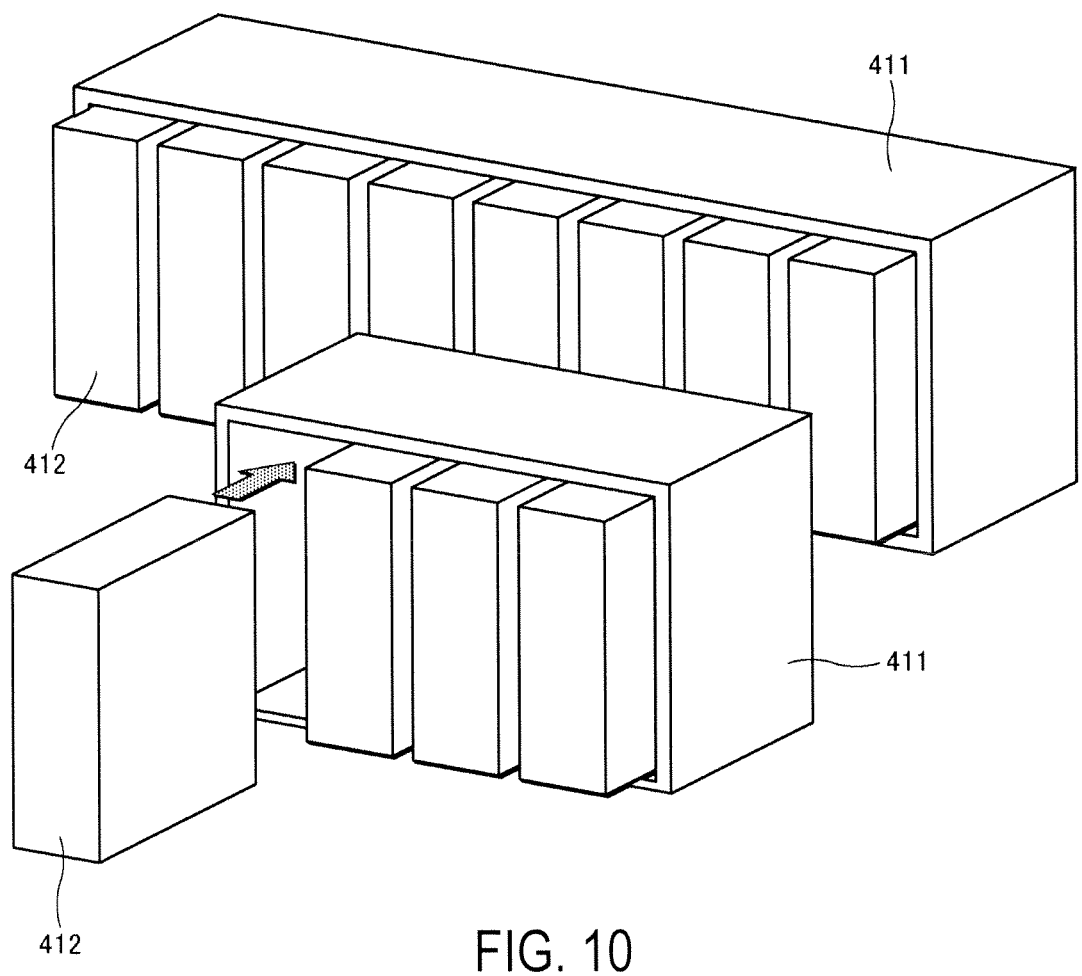
FIG. 10 is a diagram illustrating an example of connecting modules using the rack approach.
Figure 11:
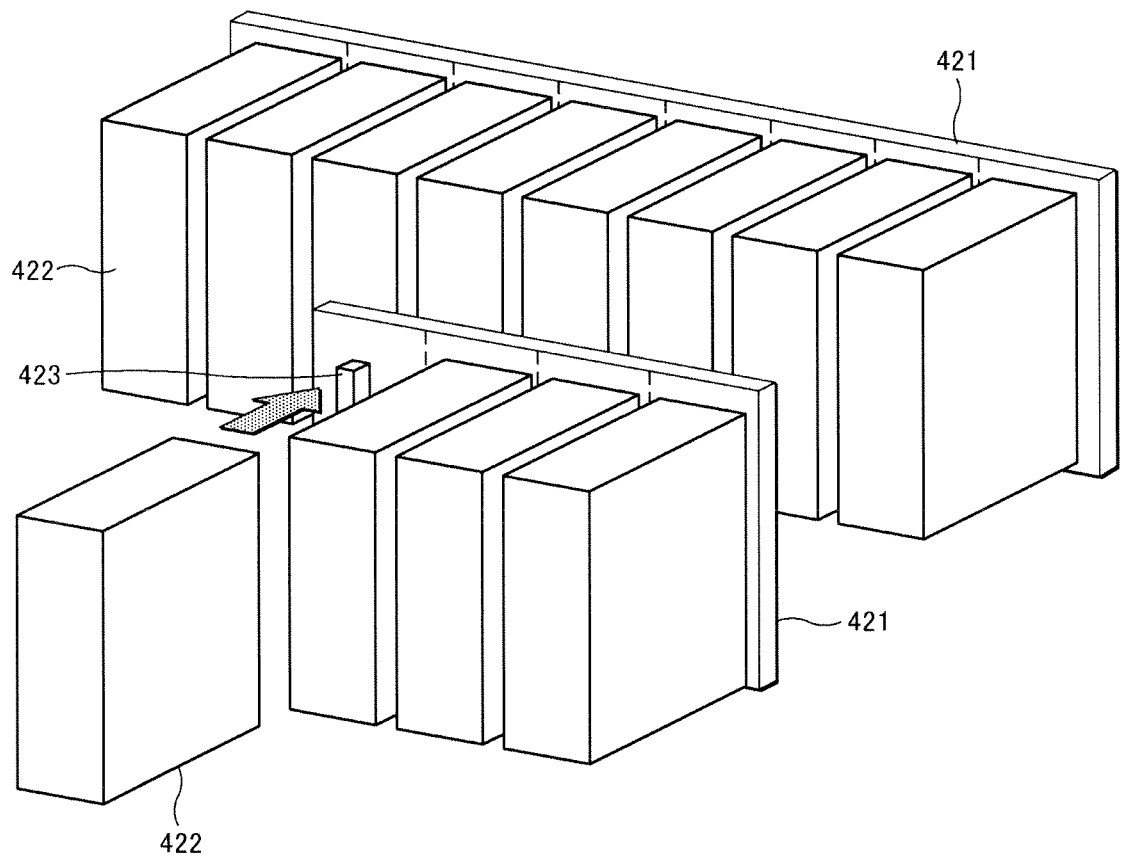
FIG. 11 is a diagram illustrating an example of connecting modules using the base plate approach.
Figure 12:
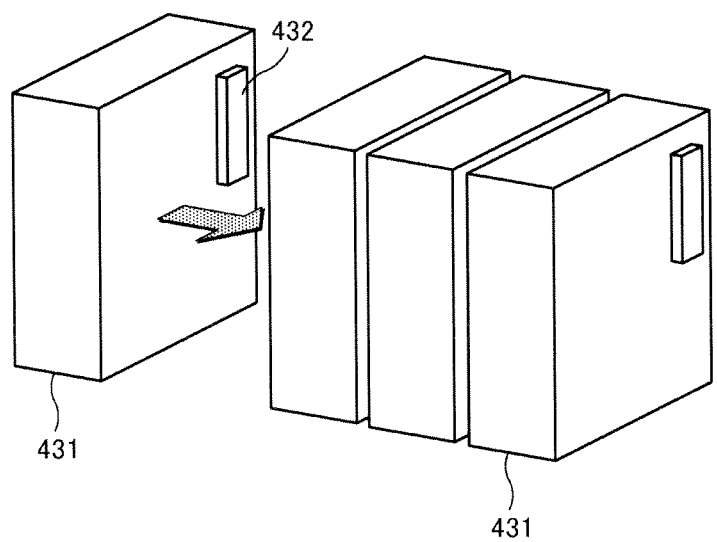
FIG. 12 is a diagram illustrating an example of the module connecting approach for connecting modules to one module on its left and right.
Figure 13:
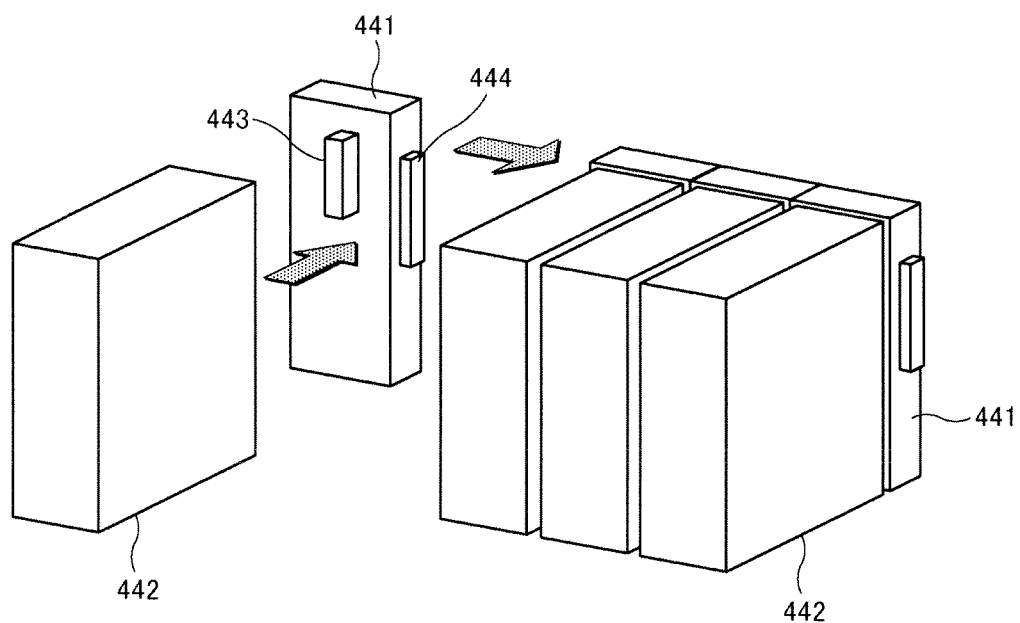
FIG. 13 is a diagram for explaining an example of the connecting member approach for connecting modules to each other using a connecting member.

Because the addresses are set automatically for each connecting receptacle 110, even if module 120 is inserted or removed, the address information for other modules 120 may not be changed. For example, as shown in FIG. 9A, when addresses 001 through 006 are assigned respectively to module A through module F, the addresses of the other modules are not changed even if module D are removed, as illustrated in FIG. 9B. Moreover, as shown in FIG. 9C, if module C and module D are swapped, then address 003 would be set for module D and address 004 would be set for module C.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A receptacle for connecting modular electronic instruments to each other, comprising:
   a box-shaped case having a front face, a bottom face, a first side face, and a second side face opposite to the first side face, the front face having an opening for inserting a single modular electronic instrument into the box-shaped case;
   a first connector disposed inside the box-shaped case, the first connector being configured to electrically connect the single modular electronic instrument to the receptacle;
   a second connector disposed on the first side face, the second connector being configured to electrically connect the receptacle to a first receptacle disposed on the side of the first side face;
   a third connector disposed on the second side face, the third connector being configured to electrically connect the receptacle to a second receptacle disposed on the side of the second side face;
   a lock configured to secure the connection with one of the first and second receptacles; and
   a leg disposed on the bottom face, the position of the leg being deviated only to one of the first or second side faces.

2. The receptacle according to claim 1, further comprising an adder configured to:
   receive an address from the first receptacle through the second connector, the address being set in the single modular electronic instrument connected to the first connector;
   add a value to the address; and
   output the address to the second receptacle through the third connector.

3. The receptacle according to claim 1, wherein
   the lock includes a convex portion, a concave portion, and a slide lock, and
   the slide lock engages a convex portion, fitted into the concave portion, of the one of the first and second receptacles.

4. The receptacle according to claim 1, wherein the second connector and the third connector are attached to the box-shaped case with play.

5. The receptacle according to claim 1, wherein:
   the lock further includes a bolt receptacle in one of the first and second side faces, and
   the bolt receptacle comprises a nut and a nut cover for holding the nut to provide the nut with play in a diagonal direction relative to the box-shaped case.

* * * * *